United States Patent [19]

Moon

[11] Patent Number: 6,049,228
[45] Date of Patent: Apr. 11, 2000

[54] LEVEL SHIFTER FOR A LIQUID CRYSTAL DISPLAY

[75] Inventor: Seung-Hwan Moon, Seoul, Rep. of Korea

[73] Assignee: Samsung Electronics, Co., Ltd., Suwon, Rep. of Korea

[21] Appl. No.: 08/990,862

[22] Filed: Dec. 15, 1997

[30] Foreign Application Priority Data

Dec. 14, 1996 [KR] Rep. of Korea ................ 96-65786

[51] Int. Cl.[7] ........................................ H03K 19/0185
[52] U.S. Cl. ............................................ 326/81; 326/86
[58] Field of Search ............................ 326/80, 81, 83, 326/86

[56] References Cited

U.S. PATENT DOCUMENTS

| | | | |
|---|---|---|---|
| 4,045,691 | 8/1977 | Asano | 326/81 |
| 4,064,405 | 12/1977 | Cricchi et al. | 326/81 |
| 4,574,273 | 3/1986 | Atsumi et al. | 326/81 |
| 4,631,426 | 12/1986 | Nelson et al. | 326/80 |
| 5,650,742 | 7/1997 | Hirano | 326/81 |

*Primary Examiner*—Jon Santamauro
*Assistant Examiner*—Don Phu Le
*Attorney, Agent, or Firm*—Marger Johnson & McCollom, P.C.

[57] ABSTRACT

This invention is related to a level shifter in an LCD using dual power voltages. A gate voltage generator generates a gate voltage through a charge pumping not to turn on both a PMOS transistor and an NMOS transistor at the same time, and the PMOS transistor is switched by the gate voltage. In this level shifter, a current to generate an output signal flows instantly only the moment the PMOS transistor and the NMOS transistor are switched, and an unwanted current path is therefore not formed. Therefore, a voltage level can be shifted without the unnecessary power consumption in the level shifter.

19 Claims, 3 Drawing Sheets

LEVEL SHIFTER FOR A LIQUID CRYSTAL DISPLAY

FIELD OF THE INVENTION

This invention relates generally to a liquid crystal display, and more particularly to a level shifter for supplying the common electrode voltage for a liquid crystal display.

BACKGROUND OF THE INVENTION

Generally, a driver of a liquid crystal display (LCD) includes both a digital part and an analogue part. The digital part controls color data signals which are outputted from a computer, such as a personal computer, and a graphic controller, and the analogue part selects a gray voltage corresponding to a gray of each pixel in accordance with the color data signals and applies the gray voltage to the LCD panel.

The color data signal is a square wave swinging between 5V and 0V. In typical twisted nematic (TN) mode of an LCD, the gray voltages are the voltages generated by dividing a voltage of 4V or 5V since the gray of pixel is displayed within a range of 4V or 5V. Therefore, a power supply in the LCD is a circuit for supplying 5V of single power voltage.

However, as the technology improves and the resolution of LCD increases, color data signals will be applied to more pixels. Therefore, the frequency of the color data signal will increase, thereby causing an electromagnetic field (EMF) in the digital part. While an increase in the resolution of LCDs is beneficial, the increase in EMF is not beneficial. In fact, generally, EMF is considered harmful to the human body at a high frequency and large voltage. Therefore, it would considered most beneficial to instead of using 5V as a driving voltage to use a lower driving voltage, such as 3.3V, to reduce the EMF harmful effects.

To overcome the above-mentioned problem, the digital part in a conventional LCD is designed to use 3.3V of a driving voltage, so the power supply supplies 5V for the analogue part and 3.3V for the digital part.

FIG. 1 shows a conventional power supply supplying dual power voltages of 3.3V and 5V. Referring to FIG. 1, a source voltage Vcc, which is a digital voltage of 3.3V, is directly outputted as the digital part voltage Vd (hereinafter digital voltage). A DC/DC converter 10 generates 5V after receiving the source voltage Vcc, and the 5V is outputted as the analogue part voltage Va (hereinafter analogue voltage).

The LCD using the above mentioned power supply requires a level shifter for shifting a voltage level. One example is the case that the 3.3V should be converted to 5V for applying the LCD panel. In detail, a common electrode voltage Vcom swinging between 5V and 0V is made by using a reverse signal swinging between 3.3V and 0V.

FIG. 2A shows a conventional level shifter, and FIG. 2B shows wave forms of input and output signals of the level shifter shown in FIG. 2A. Referring to FIG. 2A, the conventional level shifter comprises a CMOS inverter including a PMOS transistor M1 and an NMOS transistor M2. The PMOS transistor M1 receives the analogue voltage Va through its source, and the source of the NMOS transistor M2 is connected to the ground GND. The inverter receives an input signal IN swinging between the digital voltage Vd and the ground GND level through its common gate, and outputs an output signal OUT through its common drain.

Generally, the threshold voltage Vthp of the PMOS transistor M1 has a negative level, while the threshold voltage Vthn of the NMOS transistor M2 having a positive level, and the analogue voltage Va is greater than the digital voltage Vd. Therefore, the relation of each voltage can be expressed as:

$$Vthp<0<Vthn<Vd<Va.$$

According to the typical characteristics of a transistor, the PMOS transistor M1 is turned on when the gate-source voltage is less than its own threshold voltage Vthp, and the NMOS transistor M2 is turned on when the gate-source voltage is greater than its own threshold voltage Vthn.

If the input signal IN is the ground level voltage, the PMOS transistor M1 will be turned on, the NMOS transistor M2 will be turned off, and the output signal OUT keeps the analogue voltage Va level as shown in FIG. 2B.

If the input signal IN is the digital voltage Vd, the NMOS transistor M2 will be turned on since the gate-source voltage of the transistor M2 is greater than its own threshold voltage Vthn. Therefore, the output signal OUT keeps the ground GND level.

However, if the gate-source voltage of the PMOS transistor M1 is less than its own threshold voltage Vthp when the input signal IN is the digital voltage Vd, the PMOS transistor M1 will be turned on, so an unneeded and unwanted current path will be formed to lead from the analogue voltage Va through the PMOS transistor M1 and the NMOS transistor M2 to the ground.

Therefore, the unwanted current path causes the power consumption of the LCD to increase by a substantial and therefore an undesirable amount.

SUMMARY OF THE INVENTION

It is, therefore, an object of the invention to provide a level shifter which does not have special power requirements in an LCD using dual power voltages.

To achieve this object, the level shifter of the present invention comprises an inverter, an NMOS transistor, a PMOS transistor and a gate voltage generator.

The inverter inverts an input signal swinging between a first voltage and a ground level voltage, and the inverted signal swings between the first voltage and the ground level voltage.

When the inverted signal is the first voltage, the NMOS transistor is turned on, and the ground level voltage is outputted at this time. The PMOS transistor is turned on or off in accordance with the gate voltage, and a second voltage is outputted when the PMOS transistor is turned on.

The gate voltage generator generates a gate-on or a gate-off voltage using the inverted signal and the second voltage. The gate voltage generator applies the gate-on voltage for the gate of the PMOS transistor when the inverted signal is the ground level voltage, and applies the gate-off voltage for the gate of the PMOS transistor when the inverted signal is the first voltage.

In the level shifter of the present invention, a current to generate an output signal flows instantly only the moment the PMOS transistor and the NMOS transistor are switched, and an unwanted current path is not formed except for this case.

This means only one transistor is turned on between the PMOS and NMOS transistors. The gate voltage generator applies the PMOS transistor with the gate voltage not to turn on the PMOS and NMOS transistors at the same time. Furthermore, the gate voltage generator generates the gate-on voltage or the gate-off voltage by a charge pumping using the inverted signal and the second voltage.

Therefore, the level shifter of the present invention does not consume unessential power since the unwanted current path beneficially is not formed when the output signal is outputted.

BRIEF DESCRIPTION OF THE DRAWINGS

The foregoing and other objects, features and advantages of the invention will become more readily apparent from the following detailed description of a preferred embodiment of the invention which proceeds with reference to the accompanying drawings.

DETAILED DESCRIPTION OF THE EMBODIMENTS

This invention beneficially avoids the development of the unwanted current path as described above and thus reduces power consumption over a conventional level shifter while still maintaining the benefits of a level shifter which provides a reduced driving voltage of 3.3V in the digital part, and thus a reduction of harmful EMF effects to the human body. An embodiment of a level shifter in accordance with the present invention is shown in FIG. 3.

Figure 1:
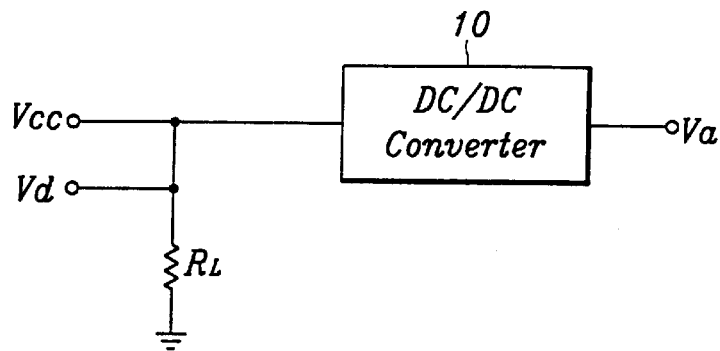
FIG. 1 shows a prior art power supply supplying dual power voltages of 3.3V and 5V.
Figure 2A:
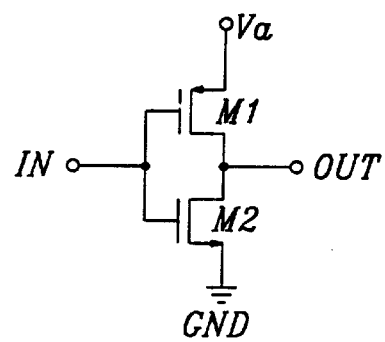
FIG. 2A shows a prior art level shifter.
Figure 2B:
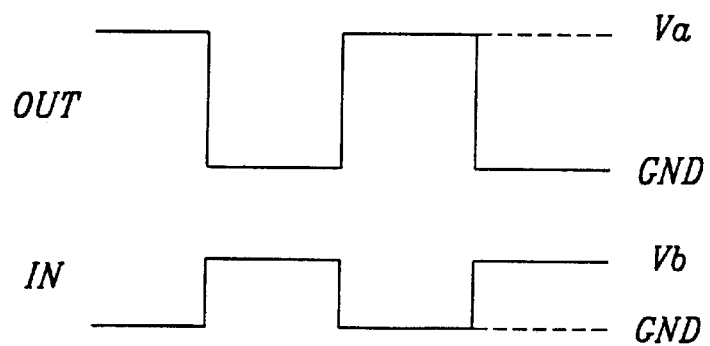
FIG. 2B shows wave forms of input and output signals of the level shifter shown in FIG. 2A.
Figure 3:
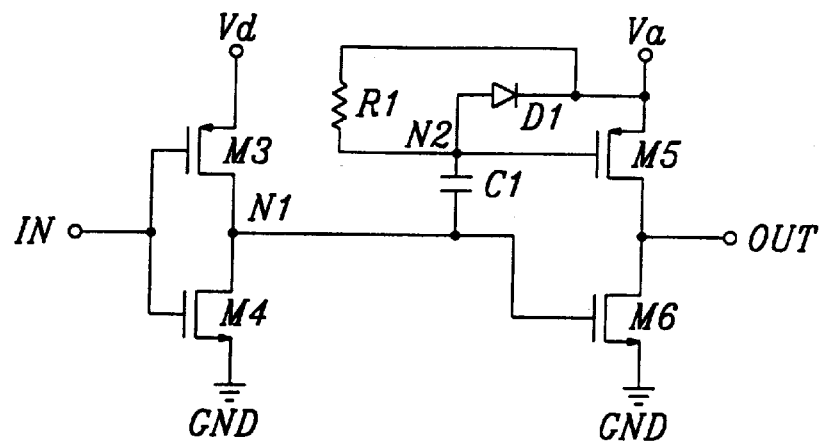
FIG. 3 shows a level shifter of the present invention.

Referring to FIG. 3, a level shifter in accordance with the present embodiment comprises two PMOS transistors M3 and M5, two NMOS transistors M4 and M6, a resistor R1, a capacitor C1 and a diode D1.

The PMOS transistor M3 and the NMOS transistor M4 have a common gate and a common drain. The PMOS transistor M3 receives the digital voltage Vd through its own source, the source of the NMOS transistor M4 is connected to the ground GND, and the common gate of the PMOS and the NMOS transistors M3 and M4 receives an input signal IN.

The PMOS transistor M5 and the NMOS transistor M6 have a common drain from which an output signal OUT is outputted. The PMOS transistor M5 receives the analogue voltage Va through its own source, the source of the NMOS transistor M6 is connected to the ground GND, and the gate of the NMOS transistor M6 is connected to the common drain of the transistors M3 and M4.

The capacitor C1 is connected between the gates of the transistors M5 and M6. The resistor R1 and the diode D1 are connected between the source and the gate of the transistor M5 in parallel, especially, the cathode of the diode D1 is connected to the source of the transistor M5.

Suppose the threshold voltage Vthp of the PMOS transistors M3 and M5 and the threshold voltage Vthn of the NMOS transistors M4 and M6 satisfy the following relations:

$Vthp<0<Vthn<Vd<Va$, and $|Vthp|<Vd<Va$.

Figure 4:
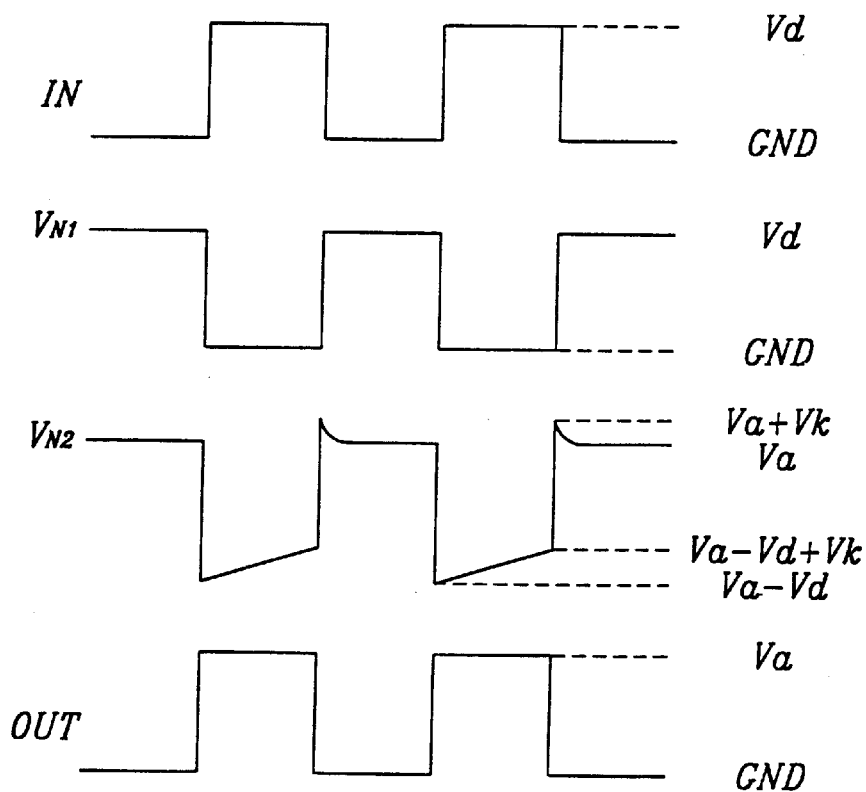
FIG. 4 shows wave forms of main part signals of the level shifter shown in FIG. 3.

As shown in FIG. 4, the input signal IN is a square wave swinging between the digital voltage Vd and the ground level voltage.

When the input signal IN is the ground level voltage, the gate-source voltage of the PMOS transistor M3 becomes −Vd, the transistor M3 is turned on since the −Vd is less than the threshold voltage Vthp, and the voltage VN1 of the common drain node N1 of the transistors M3 and M4 becomes the digital voltage Vd.

When the input signal IN is the digital voltage Vd level, the NMOS transistor M4 is turned on, and the node voltage VN1 becomes the ground level voltage.

The NMOS transistor M6 is turned on when the node voltage VN1 is the digital voltage Vd. In addition, the gate node voltage VN2 of the PMOS transistor M5 becomes the analogue voltage Va since no current flows through the resistor R1, and the PMOS transistor M5 is turned off, so the output signal OUT becomes the ground level voltage. At this time, the difference (Va−Vd) of the node voltages VN1 and VN2 is applied to both terminals of the capacitor C1.

When the node voltage VN1 changes from the digital voltage Vd to the ground level voltage, the NMOS transistor M6 is turned off. Furthermore, in the moment the node voltage VN1 changing to the ground level voltage GND, the node voltage VN2 becomes (Va−Vd) which was a voltage between both terminals of the capacitor C1. As time goes on, the node voltage VN2 increases gradually through charging of the capacitor C1 by the analogue voltage Va.

The charging path of the capacitor C1 leads from the analogue voltage Va through the resistor R1, the capacitor C1 and the NMOS transistor M4 to the ground GND. If the voltage charged to the capacitor C1 is Vk and the half cycle of the input signal IN is T, the voltage Vk can be expressed like below:

$$Vk=Va\{1-EXP(-T/R1(C1)\} \qquad (1)$$

Accordingly, the node voltage VN2 increases from (Va−Vd) to (Va−Vd+Vk) during the node voltage VN1 is the ground level voltage, and a level-up output signal Va is outputted during this period. As above-mentioned, the gate-source voltage of the transistor M5 should be less than its own threshold voltage Vthp to be turned on. A related expression of ((Va−Vd+Vk−Va)<Vthp) should be satisfied since the gate-source voltage of the transistor M5 is (VN2−Va), so an expression is formed like below:

$$-Vd+Vk<Vthp \qquad (2)$$

If the expression (2) is substituted for the expression (1), an expression is formed like below:

$$R1(C1>-T/ln\{1-(Vthp+Vd)/Va\} \qquad (3)$$

Therefore, the transistor M5 can be turned on when the node voltage VN1 is the ground level voltage and the resistor R1 and the capacitor C1 is selected to satisfy the expression (3). The output signal OUT keeps the analogue voltage Va level by turning on the transistor M5.

The node voltage VN2 increases from (Va−Vd+Vk) to (Va+Vk) and the next decreases to Va gradually when the node voltage VN1 changes again to the digital voltage Vd level.

When the node voltage VN2 is greater than the analogue voltage Va, the diode D1 is turned on, so the node voltage VN2 becomes stable to the analogue level Va. As above-mentioned, only the transistor M6 is turned on during this period, so the output signal OUT becomes the ground level voltage.

In the level shifter of the present invention, the transistors M3 to M6 perform only the switching operation and do not form the unwanted current path. Therefore, the special power is not consumed when the output signal is outputted.

Figure 5:
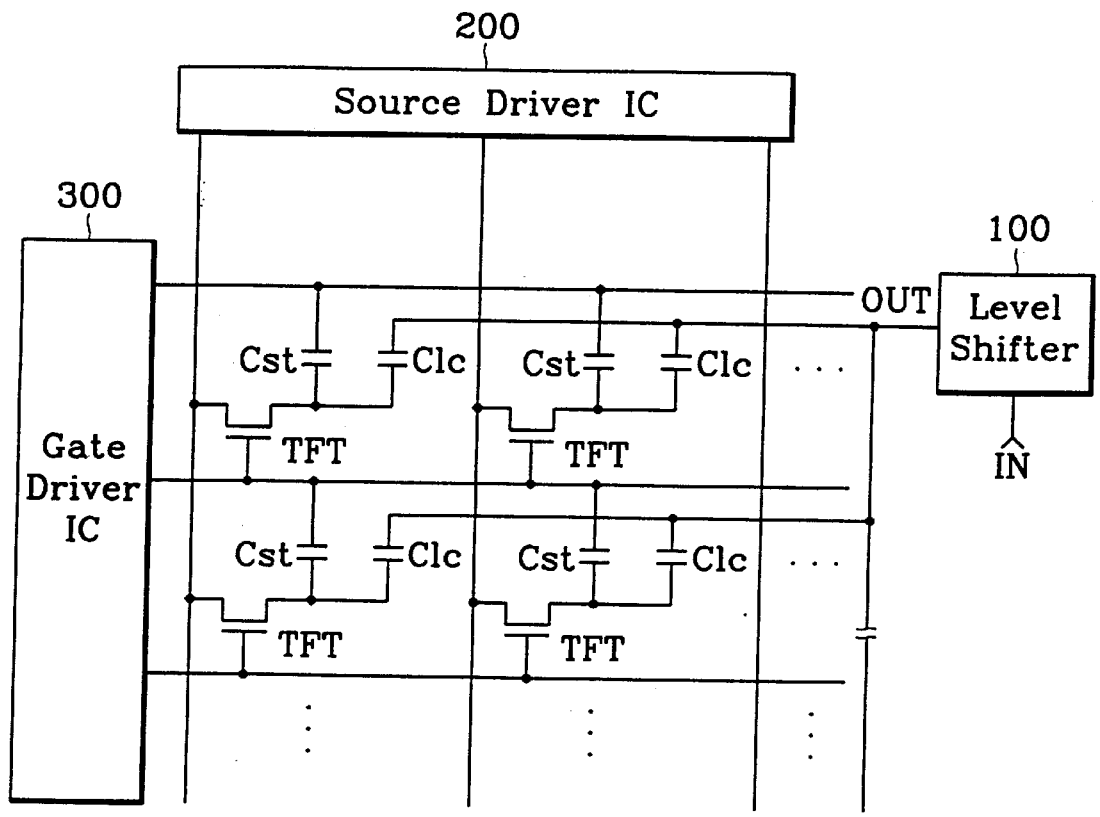
FIG. 5 shows a liquid crystal display applying the level shifter shown in FIG. 3.

As shown in FIG. 5, the output voltage OUT of the level shifter 100 is applied to the common electrode of each liquid crystal capacitor Clc which receives a pixel data through the pixel electrode.

An advantage of the level shifter constructed in accordance with the present invention is that the voltage level can be shifted without the special power consumption in an LCD using dual power voltages.

What is claimed is:

1. A level shifter comprising:

an inverter that inverts an input signal swinging between a first voltage and a ground level voltage;

an NMOS transistor that is either turned on or turned off in response to the inverted signal from the inverter, the inverted signal applied at the gate of the NMOS transistor, the ground level voltage applied at the source of the NMOS transistor, the NMOS transistor outputting the ground level voltage at its drain when turned on;

a PMOS transistor that is either turned on or turned off in response to a gate-on voltage applied at its gate, the PMOS transistor having a second voltage applied at its source, the drain of the PMOS transistor connected to the drain of the NMOS transistor, the PMOS transistor outputting the second voltage at its drain when turned on; and a gate voltage generator comprising a resistor connected between the source and gate of the PMOS transistor, and a capacitor connected between the gates of the PMOS and NMOS transistors, the generator generating the gate-on voltage at the gate of the PMOS transistor when the inverted signal is the ground level voltage, and generating a gate-off voltage at the gate of the PMOS transistor when the inverted signal is the first voltage.

2. The level shifter of claim 1, further comprising a diode connected between the source and gate of the PMOS transistor.

3. The level shifter of claim 1, wherein the resistance R1 of the resistor and the capacitance C1 of the capacitor are determined by the following expression:

$$R1 \cdot C1 > -T/ln\{1-(Vthp+Vd)/Va\},$$

where T is a half cycle of the input signal, Vthp is a threshold voltage of the PMOS transistor, Vd is the first voltage and Va is the second voltage.

4. A level shifter having a shifter input and a shifter output, the level shifter comprising:

an NMOS transistor/PMOS transistor pair having their drains connected together, the output of the transistor pair taken at the connected drains, the NMOS transistor having its source coupled to an NMOS transistor supply voltage, the PMOS transistor having its source coupled to a PMOS transistor supply voltage, the input of the transistor pair taken at the gate of one of the transistors; and a gate voltage generator circuit connected to the gate of the other of the transistors, the gate voltage generator circuit comprising a resistor connected between the gate of the other of the transistors and the supply voltage for that transistor, and a capacitor connected between the gates of the transistors.

5. The level shifter of claim 4, wherein the gate voltage generator circuit further comprises a diode in parallel with the resistor.

6. The level shifter of claim 5, further comprising an inverter coupled to the transistor pair such that the level shifter has a high shifter output for a high shifter input and a low shifter output for a low shifter input.

7. The level shifter of claim 6, wherein the inverter is coupled between the shifter input and the transistor pair input.

8. The level shifter of claim 7, wherein the input of the transistor pair is taken at the gate of the NMOS transistor.

9. The level shifter of claim 8, wherein the resistance R1 of the resistor and the capacitance C1 of the capacitor are determined by the following expression:

$$R1 \cdot C1 > -T/ln\{1-(Vthp+Vd)/Va\},$$

where T is a half cycle of the level shifter input signal, Vthp is a threshold voltage of the PMOS transistor, Vd is the upper voltage limit of the level shifter input signal, and Va is the PMOS transistor supply voltage.

10. The level shifter of claim 4, further comprising an inverter coupled to the transistor pair such that the level shifter has a high output for a high input and a low output for a low input.

11. The level shifter of claim 10, wherein the inverter is coupled between the shifter input and the transistor pair input.

12. The level shifter of claim 11, wherein the input of the transistor pair is taken at the gate of the NMOS transistor.

13. The level shifter of claim 12, wherein the resistance R1 of the resistor and the capacitance C1 of the capacitor are determined by the following expression:

$$R1 \cdot C1 > -T/ln\{1-(Vthp+Vd)/Va\},$$

where T is a half cycle of the level shifter input signal, Vthp is a threshold voltage of the PMOS transistor, Vd is the upper voltage limit of the level shifter input signal, and Va is the PMOS transistor supply voltage.

14. A level shifter for an LCD, comprising:

an inverter that inverts an input signal swinging between a first supply voltage and a ground voltage;

an NMOS transistor/PMOS transistor pair having their drains connected together, the output of the transistor pair taken at the connected drains, the NMOS transistor having its source coupled to the ground voltage, the PMOS transistor having its source coupled to a PMOS transistor supply voltage, the gate of the NMOS transistor connected to the inverted input signal; and a gate voltage generator circuit connected to the gate of the PMOS transistor, the gate voltage generator circuit comprising a resistor connected between the gate of the PMOS transistor and the PMOS transistor supply voltage, and a capacitor connected between the gates of the transistors.

15. The level shifter of claim 14, wherein the gate voltage generator circuit further comprises a diode in parallel with the resistor.

16. The level shifter of claim 14, wherein the resistance R1 of the resistor and the capacitance C1 of the capacitor are determined by the following expression:

$$R1 \cdot C1 > -T/ln\{1-(Vthp30\ Vd)/Va\},$$

where T is a half cycle of the level shifter input signal, Vthp is a threshold voltage of the PMOS transistor, Vd is the upper voltage limit of the level shifter input signal, and Va is the PMOS transistor supply voltage.

17. A method of driving an NMOS/PMOS complementary transistor pair with an input signal having an insufficient voltage range to operate the pair in a complementary fashion by direct connection of the input signal to the gates of both transistors, the method comprising:

driving the gate of the NMOS transistor with the input signal;

coupling the input signal to the gate of the PMOS transistor through a capacitor; and providing a resistive charging path from the gate of the PMOS transistor to the PMOS transistor's supply voltage.

18. The method of claim 17, further comprising providing a diode-connected discharging path in parallel with the resistive charging path.

19. The method of claim 18, wherein the input signal has a known half-cycle and wherein the capacitance of the capacitor and the resistance of the resistive charging path provide for charging of the capacitor by a voltage increment insufficient to turn on the PMOS transistor during a half-cycle in which the PMOS transistor is initially off.

* * * * *

UNITED STATES PATENT AND TRADEMARK OFFICE
CERTIFICATE OF CORRECTION

PATENT NO.    : 6,049,228
DATED         : April 11, 2000
INVENTOR(S)   : Moon

It is certified that error appears in the above-identified patent and that said Letters Patent is hereby corrected as shown below:

Column 6,
Line 60, "(Vthp30 Vd)" should read -- (Vthp+Vd) --;

Column 8,
Line 4, "claim 18" should read -- claim 17 --.

Signed and Sealed this

Eleventh Day of March, 2003

JAMES E. ROGAN
*Director of the United States Patent and Trademark Office*